United States Patent [19]

Löcherer

[11] 4,158,817
[45] Jun. 19, 1979

[54] MICROWAVE INPUT CIRCUIT WITH PARAMETRIC DOWN CONVERTER

[75] Inventor: Karl-Heinz Löcherer, Langenhagen, Fed. Rep. of Germany

[73] Assignee: Licentia Patent-Verwaltungs G.m.b.H., Frankfurt, Fed. Rep. of Germany

[21] Appl. No.: 818,326

[22] Filed: Jul. 22, 1977

[30] Foreign Application Priority Data

Jul. 24, 1976 [DE] Fed. Rep. of Germany ....... 2633421

[51] Int. Cl.² .......................... H04B 1/16; H04B 1/26; H03F 7/00
[52] U.S. Cl. ................................... 325/485; 325/442; 330/4.9
[58] Field of Search .................. 325/4, 365, 371, 485, 325/442, 451; 307/88.3; 330/4.5, 4.9

[56] References Cited

U.S. PATENT DOCUMENTS

| | | | |
|---|---|---|---|
| 3,237,017 | 2/1966 | Maurer et al. | 307/88.3 |
| 3,711,780 | 1/1973 | Maurer | 330/4.5 |
| 3,991,373 | 11/1976 | Maurer et al. | 325/485 |

OTHER PUBLICATIONS

"Varactor Applications;" The M.I.T. Press, 1962; Penfield, Jr. et al.
"Parametrischer Mikrowellen-Konoverter," A.E.U., vol. 26, No. 11, 1972, pp. 475–480; Maurer and Löcherer.

*Primary Examiner*—Robert L. Griffin
*Assistant Examiner*—Aristotelis M. Psitos
*Attorney, Agent, or Firm*—Spencer & Kaye

[57] ABSTRACT

A microwave input circuit including a parametric upper sideband down converter for receiving an input signal whose frequency is not much different from the intermediate frequency produced at the output of the down converter. The down converter may be either of the series type or of the parallel type and has its signal input directly connected to a microwave antenna and terminated by the real antenna resistance ($R_g$) or the real antenna conductance ($G_g$), respectively, at the input signal frequency ($f_{s1}$). The parametric down converter comprises a cascade connection of a parametric down converter stage and a parametric up converter stage with both of said stages being of the series type or of the parallel type. The down converter stage is terminated at its image frequency ($f_{sp}$) with a real resistance ($R_{sp}$) or a real conductance ($G_{sp}$), respectively, and satisfies the following relationship for a series type down converter:

$$\frac{f_{s1}}{f_{sp}} \cdot \frac{R_g + R_{s1}}{R_{sp} + R_{s1}} \approx 1$$

where $R_{s1}$ is the series resistance of the reactance diode in the down converter stage, or the following relationship for a parallel type down converter:

$$\frac{f_{sp}}{f_{s1}} \cdot \frac{G_g + G_{D1}}{G_{sp} + G_{D1}} \approx 1$$

where $G_{D1}$ is the conductance loss of the reactance diode in the down converter stage, due to $R_{s1}$.

20 Claims, 6 Drawing Figures

SERIES TYPE M
DOWN CONVERTER

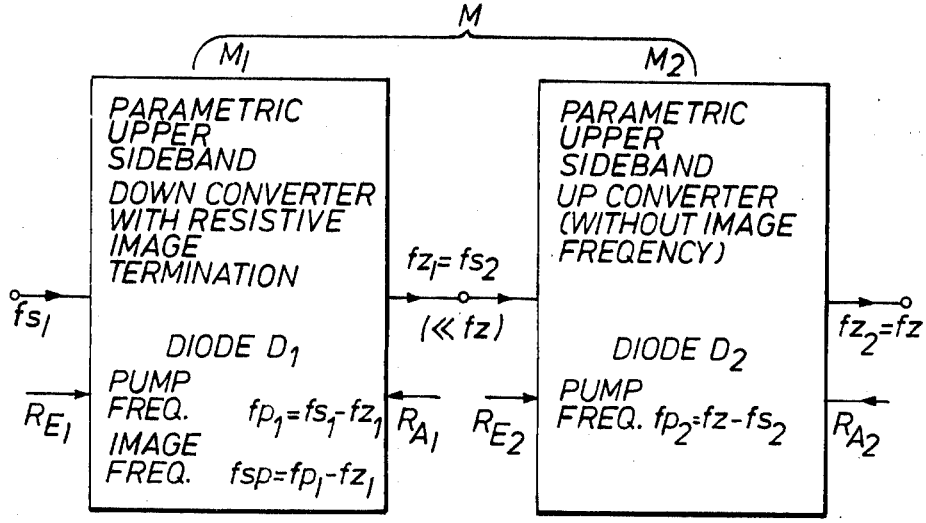
FIG. 1
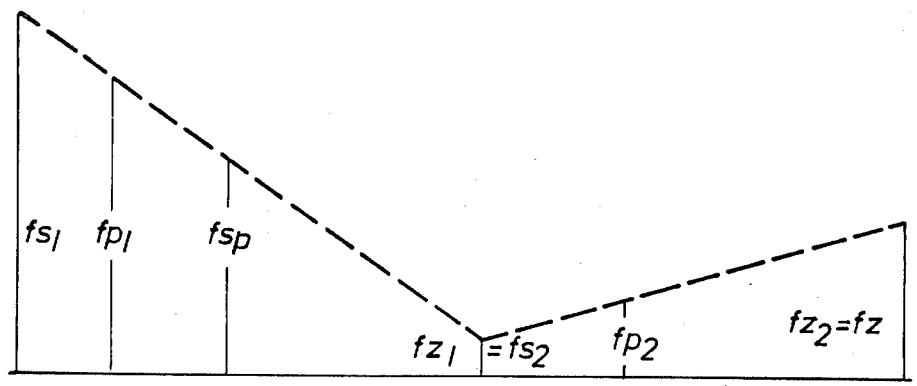
FIG. 2
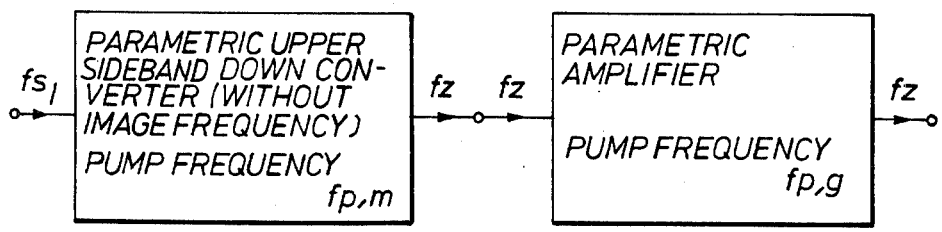

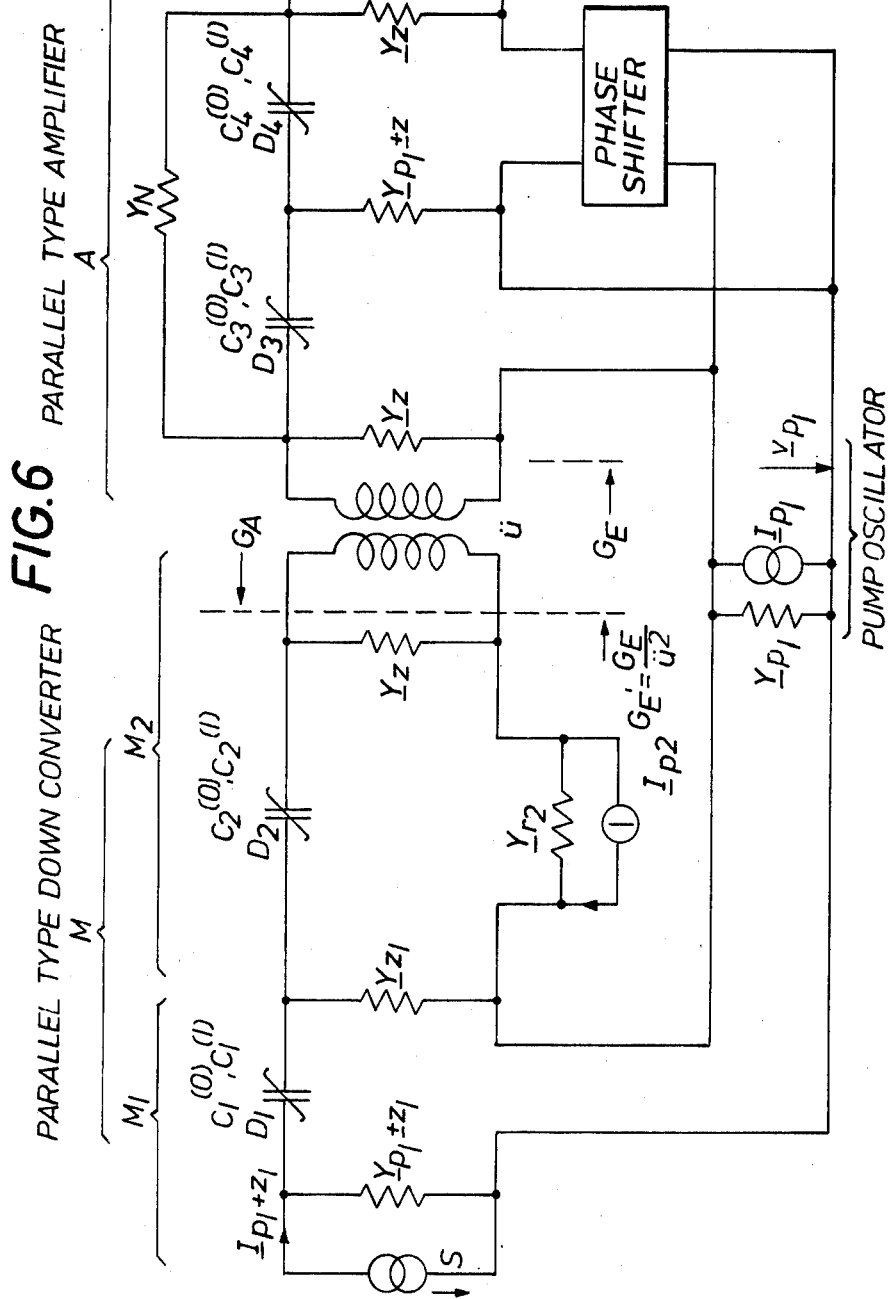

MICROWAVE INPUT CIRCUIT WITH PARAMETRIC DOWN CONVERTER

BACKGROUND OF THE INVENTION

The present invention relates to a microwave input circuit with parametric upper sideband down converter which is directly connected to a microwave antenna. More particularly, the present invention relates to such a parametric down converter which is terminated by a real impedance at the input signal frequency which is not much different from the intermediate frequency produced at the output of the down converter.

Parametric amplifiers per se are known, for example from the book, VARACTOR APPLICATIONS, by P. Penfield and R. P. Rafuse, published by M.I.T. Press, 1962. It is also known from U.S. Pat. No. 3,991,373, issued Nov. 9, 1976 to Maurer et al. (the subject matter of which is incorporated herein by reference) to directly connect a down converter to the receiving antenna for microwaves and to employ for this purpose a parametric upper sideband down converter which is terminated with a real impedance at the image frequency. However, the down converter disclosed in this patent will have little noise only if the input signal frequency $f_{s1}$ is much greater than the intermediate frequency $f_z$ produced at the output of the down converter (see column 4, equation (5) of the patent).

SUMMARY OF THE INVENTION

It is the object of the present invention to provide an input circuit for microwaves which includes a parametric down converter and which amplifies and has low noise even if the ratio $f_{s1}/f_z$ is not much greater than unity (in which case the input signal frequency $f_{s1}$ and the image $f_{sp}=f_{p1}-f_z=f_{s1}-2f_z$ are far apart) and if the noise temperature $T_{sp}$ of the image frequency termination is less than the noise temperature $T_D$ of the reactance diode. In this case, the converter noise temperature $T_m$ is of the same order of magnitude as the noise temperature $T_D$, but this is sufficient, for example, for terrestrial radiometer application.

The above object is accomplished by constructing the input circuit of the microwave receiving system in accordance with the present invention. The input circuit includes a parametric upper sideband down converter which has its signal input directly connected to the microwave antenna and terminated by the real portion of the antenna impedance.

The parametric down converter of the input circuit may be either of the series type of the parallel type and comprises the cascade connection of a parametric down converter stage and a parametric up converter stage with both stages being either of the series or of the parallel type. Each of the stages includes a reactance diode wherein the input signal to the respective stage is mixed with a respective pump frequency produced by a pump oscillator to produce a desired intermediate frequency at the output of the respective stage. The output of the up converter stage, and hence the output of the entire down converter stage, is connected to further amplifying stages of the receiving system.

If a series type parametric down converter is utilized, then the signal input of the down converter is terminated by the real antenna resistance ($R_g$) at the input signal frequency ($f_{s1}$) and the down converter stage is terminated at its image frequency ($f_{sp}$) by a real resistance ($R_{sp}$) and satisfies the following relationship:

$$\frac{f_{s1}}{f_{sp}} \cdot \frac{R_g + R_{s1}}{R_{sp} + R_{s1}} \approx 1$$

where $R_{s1}$ is the series resistance of the reactance diode in the down converter stage.

If a parallel type parametric down converter is utilized, however, then the signal input of the down converter is terminated by the real antenna conductance ($G_g$) at the input signal frequency ($f_{s1}$), and the down converter stage is terminated by a real conductance ($G_g$) at its image frequency ($f_{sp}$) and satisfies the following relationship:

$$\frac{f_{sp}}{f_{s1}} \cdot \frac{G_g + G_{D1}}{G_{sp} + G_{D1}} \approx 1$$

where $G_g$ is the conductance loss of the reactance diode in the down converter stage, due to $R_{s1}$.

The output of the parametric down converter according to the invention is preferably coupled to a noise-matched IF amplifier. If the down converter is of the series type, then the subsequently connected noise-matched IF amplifier should satisfy the following relationship for $R_{s1} = R_{s2}$:

$$\frac{R_E}{R_{s,min}} \approx \frac{f_{z1}}{f_{s1}} \cdot \frac{1}{q_1}$$

where
- $R_E$ = the input resistance of the IF amplifier;
- $R_{s,min}$ = the resistance of the signal source of the IF amplifier for minimum noise;
- $f_{Z1}$ = the intermediate frequency produced by the first or down converter stage of the down converter;
- $q_1$ = the dynamic quality factor of the reactance diode in the down converter stage;
- $R_{s2}$ = the series resistance of the reactance diode in the up converter stage.

Alternatively, if the down converter according to the invention is of the parallel type, then the subsequently connected noise-matched IF amplifier should satify the following relationship:

$$\frac{G_E}{G_{s,min}} \approx \frac{f_{z1}}{f_{s1}} \cdot \frac{1}{q_1}$$

where
- $G_E$ = the input conductance of the IF amplifier;
- $G_{s,min}$ = the conductance of the signal source of the IF amplifier for minimum noise;
- $f_{z1}$ = the intermediate frequency produced by the first or down converter stage of the down converter;
- $q_1$ = the dynamic quality factor of the reactance diode in the down converter stage.

The IF amplifiers can be realized by a number of different circuit configurations. Preferably, however, they are parametric converter cascade amplifiers.

BRIEF DESCRIPTION OF THE DRAWINGS

FIG. 1 is a block diagram illustrating the basic scheme for the entire down converter M according to the invention which includes the cascade connection of a down converter stage $M_1$ and an up converter stage $M_2$, as well as the associated frequency scheme.

FIG. 2 is a block diagram of another possible solution of the problem, which possible solution is an unfavorable one, however.

FIG. 6 is the equivalent circuit diagram of the entire down converter M of the parallel type according to the invention and a subsequently connected IF amplifier of the parallel type, realized by a parametric converter cascade.

DETAILED DESCRIPTION OF THE PREFERRED EMBODIMENTS

Figure 3:
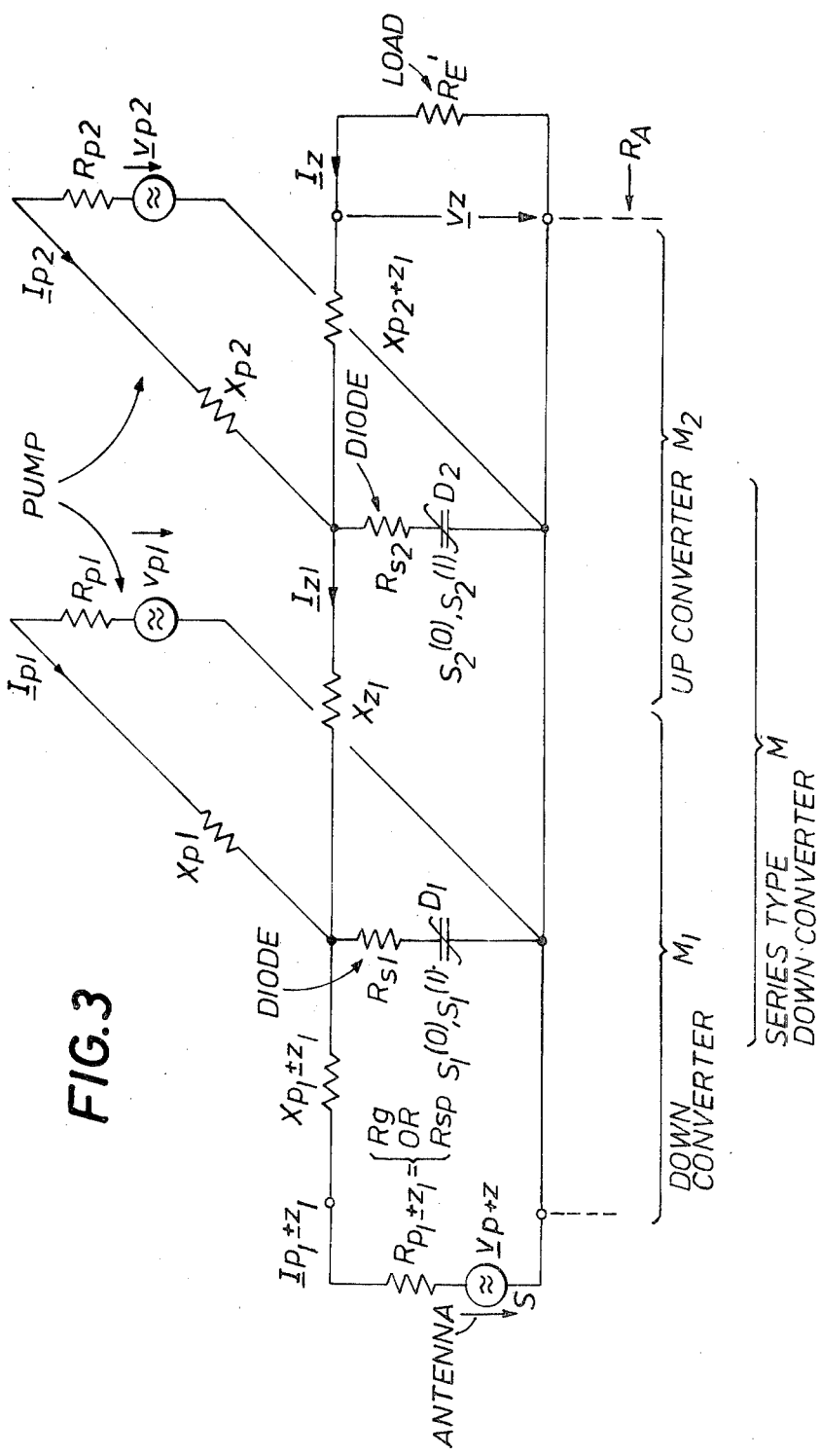
FIG. 3 is the basic equivalent circuit diagram of the entire down converter M of the series type according to the invention.

Referring now to FIG. 1, there is shown the basic block diagram of a down converter according to the invention for converting an input signal $f_{s1}$ supplied by a directly connected antenna to an intermediate frequency output signal $f_z$. As shown, the entire down converter M includes the cascade connection of a down converter stage $M_1$ with a real image frequency termination and a known conventional up converter stage $M_2$, as shown, for example, in the above identified VARACTOR APPLICATIONS book in Section 5.2, pages 99 et seq. In the down converter stage $M_1$, the input signal frequency $f_{s1}$ is mixed in a reactance diode $D_1$ with the pump frequency $f_{p1}$ to form an output signal at an intermediate frequency $f_{z1}$ which, as shown, is less than the desired final intermediate frequency $f_z$, while in the up converter stage $M_2$ the intermediate frequency signal $f_{z1}=f_{s2}$ is mixed in a further reactance diode $D_2$ with a pump frequency $f_{p2}$ to form the desired intermediate frequency $f_{z2}=f_z$ at the output of the up converter stage.

The down converter stage $M_1$ is terminated at its image frequency $f_{sp}=f_{p1}-f_{z1}$ with a real impedance $R_{sp}$ (noise temperature $T_{sp}$) and, due to the relationship $f_{s1} \gg f_{z1}$, has a low noise figure as described in the above-identified U.S. Patent to Maurer et al. Moreover, the down converter stage $M_1$ provides an available conversion gain (see AEÜ (1972), Issue 11, pages 475-480, equation (20)).

The second or up converter stage $M_2$ likewise furnishes, by itself and with optimum dimensioning, an available conversion gain and a low noise temperature (see VARACTOR APPLICATIONS book, Section 5.2.2, pages 104 et seq.). Whether this also applies for the cascade connection as in the present invention depends on the magnitude of the "source resistance" $R_{A1}$(=output resistance of the first or down converter stage $M_1$). However, a theoretical investigation has shown that this is true. The available conversion gain in the up converter stage $M_2$, however, is less by about the factor 2 than the optimum value $f_z/f_{z1}$ (according to the Manley-Rowe equations). Moreover, the noise temperature $T_2$ is only slightly higher than the diode temperature $T_D$. However, according to the Friis formula, this amount plays only an insignificant part since the first or down converter stage $M_1$ has gain.

For comparison purposes, FIG. 2 shows a block diagram for a possible arrangement for a microwave system input circuit which includes a parametric upper sideband down converter without image frequency and which directly converts the input signal frequency $f_{s1}$ to the desired intermediate frequency $f_z$, followed by a parametric amplifier.

Compared to this likewise possible concept of FIG. 2, the arrangement of FIG. 1 has the following advantages:

1. the converter of the arrangement of FIG. 2 will have low noise but will have a conversion loss (see VARACTOR APPLICATIONS book, Section 5.4, pages 144 et seq.). This conversion loss thus must be compensated in the subsequently connected amplifier which may possibly require a multistage amplifier. This is not the case with the arrangement of FIG. 1 according to the invention.

2. The amplifier in the arrangement of FIG. 2 must have extremely low noise since its noise contribution is significant due to the conversion loss in the converter. Thus a very high pump frequency $f_{p,g} \gg f_z$ (generally also $f_{p,g} \gg f_{s1}$) must be used in the amplifier of the possible arrangement of FIG. 2. In contradiction, in the arrangement according to FIG. 1, the highest occurring frequency is the input signal frequency $f_{s1}$, and the pump frequency $f_{p2}$ for the up converter stage $M_2$ is significantly smaller than $f_{s1}$. Under certain circumstances it is even possible with the arrangement according to FIG. 1 to use only one pump frequency oscillator, namely the oscillator for generating the pump frequency $f_{p2}$ for the stage $M_2$, and to generate the pump frequency $f_{p1}$ for the stage $M_1$ by frequency multiplication ($f_{p2}=nf_{p1}$) of the pump frequency $f_{p2}$ with a low order of magnitude n (for example n=3).

The down converter M of FIG. 1 may be realized by using either a series type down converter stage in cascade connection with a series type up converter stage, or a parallel type down converter stage in cascade connection with a parallel type up converter stage. Depending on whether series or parallel type mixer stages are used, the down converter circuit arrangement of FIG. 1 according to the invention must satisfy one of the following relationships:

$$1 \approx \begin{cases} \dfrac{f_{s1}}{f_{sp}} \cdot \dfrac{R_g + R_{s1}}{R_{sp} + R_{s1}} \text{ for series type mixers} & (1) \\ \\ \dfrac{f_{sp}}{f_{s1}} \cdot \dfrac{G_g + G_{D1}}{G_{sp} + G_{D1}} \text{ for parallel type mixers} & (2) \end{cases}$$

This is the result of theoretical consideration which are not represented here. For the total circuit or chain of FIG. 1, it then applies (in approximation) that the available conversion gain $L_v$ of the chain is $$L_{v,chain} = \frac{q_1}{2} \cdot \frac{f_z}{f_{z1}} \qquad (3)$$

(for mixer $M_1$, $L_{v1} = q_1$ and for mixer $M_2$, $L_{v2} = \frac{1}{2} \cdot \frac{f_z}{f_{z1}}$)

where $q_1$ = the dynamic quality factor of the reactance diode $D_1$ in converter stage $M_1$; that the minimum noise temperature of the converter cascade is $$T_{casc.} = \frac{f_{s1}}{f_{sp}} \cdot T_{sp} + \frac{4}{q_1} \cdot T_D; \quad (4)$$

and that the associated optimum generator resistance, i.e., the real resistance of the antenna, the following applies:

$$R_{g,opt} = q_1 \cdot R_{s1} \quad (5)$$

where $R_{s1}$ = series resistance of the reactance diode in the converter stage $M_1$.

In order to illustrate the operation and advantages of the present invention by means of a numerical example, consider the following numerical values:
$f_{s1} = 28$ GHz; $f_z = 12$ GHz; $f_{z1} = 2$ GHz;
$f_{sp} = 24$ GHz; $q_1 = 7$ From equations (3), (4) and (5) the following then applies:

$$L_{v,casc} = 21;$$

$$T_{casc} = \begin{cases} 504° \text{ K. for } T_{sp} = T_D = 290° \text{ K.} \\ 224° \text{ K. for } T_{sp} = 50° \text{ K.} \\ \quad\quad\quad\quad\quad T_D = 290° \text{ K.; and} \end{cases}$$

$$R_{g,opt} = 7 \cdot R_{s1}$$

If, instead of using a cascade connection of a down converter stage $M_1$ and an up converter stage $M_2$ as shown in FIG. 1, the down conversion from $f_{s1} = 28$ GHz to $f_z = 12$ GHz is handled by converter $M_1$ alone, the following data result for the noise minimum:

|  | $T_{sp} = T_D = 290°$ K. | $T_{sp} = \frac{1}{6} T_D = 48.3°$ K. |
|---|---|---|
| $R_{g, opt}$ | $20 \cdot R_{s1}$ | $12.3 \cdot R_{s1}$ |
| $\left(\frac{T_1}{T_D}\right)_{min}$ | $7.84 = 2270°$ K. | $1.7 = 493°$ K. |
| $L_{v1}$ | 2.27 | 3.47 |

This clearly shows that this latter solution is of no use.

Figure 4:
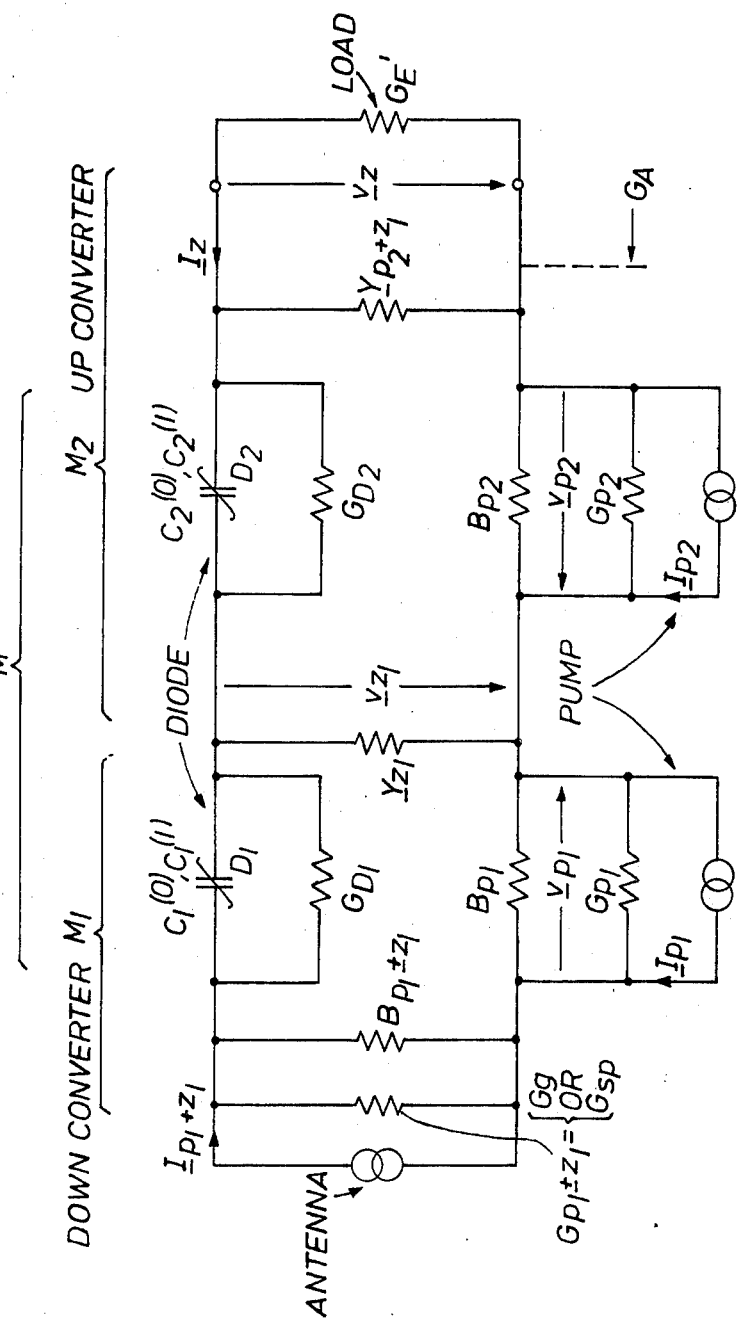
FIG. 4 is the basic equivalent circuit diagram of the entire down converter M of the parallel type according to the invention.

Referring now to FIGS. 3 and 4, there is shown the circuit principle for the entire down converter M according to the invention with FIG. 3 showing such a converter of the series type and FIG. 4 showing such a converter of the parallel type. Each figure includes one known down converter stage $M_1$ with resistive image termination (as disclosed, for example, in the above-identified VARACTOR APPLICATIONS book and the AEÜ article) and a known conventional up converter stage $M_2$ without image frequency (e.g. as also disclosed in the VARACTOR APPLICATIONS book). In these figures, the following legends apply:

$p_1$, $p_2$ = the pump circuit frequencies for the respective stages $M_1$ and $M_2$; $= 2\pi f_{p1}$ and $2\pi f_{p2}$, respectively $z_1$ = the intermediate frequency produced by the stage $M_1 = 2\pi f_{z1}$ $p_2 + z_1 = z_2$ = the intermediate frequency produced by the stage $M_2 = 2\pi f_{z2} = 2\pi f_z$ $p_1 + z_1 = s_1$ = input signal circuit frequency = $2\pi f_{s1}$ $p_1 - z_1 = sp$ = image frequency = $2\pi f_{sp}$ In the equivalent circuit of the input circuit according to the present invention shown in FIG. 3, the antenna S is effectively represented by the signal source $\underline{V}_{p+z}$ and the resistance $R_{p1}^{\pm z_1}$. The reactance of the input circuit is represented by $X_{p1}^{\pm z_1}$ and the current through the antenna by $\underline{I}_{p1}^{\pm z_1}$.

The signal coming from the antenna, which is directly connected to the signal input of the parametric down converter stage $M_1$ of the series type, is mixed in the parametric down converter stage $M_1$ with a pump frequency $f_{p1}$ in order to effectively demodulate the incoming signal. The pump frequency $f_{p1}$ is generated by a pump circuit which is represented by a source $\underline{V}_{p1}$, a resistance $R_{p1}$ and a reactance $X_{p1}$ and which has a current $\underline{I}_{p1}$. This pump frequency $f_{p1}$ is converted with the incoming signal in the reactance diode $D_1$ which has a series resistance $R_{s1}$. The signal, after being processed by the parametric down converter stage $M_1$, is now at an intermediate frequency of $f_{z1}$. The parameters of this parametric down converter stage $M_1$ are selected so as to satisfy equation (1) and, as shown, the down converter stage $M_1$ is terminated by the real antenna resistance at both the signal frequency and at the image frequency.

The output circuit of the parametric down converter stage $M_1$, which is shown as a reactance $X_{z1}$, is connected to the input of the up converter stage $M_2$ which, as shown, includes a further reactance diode $D_2$, having a series resistance $R_{s2}$, wherein the intermediate frequency $f_{z1}$ produced by the down converter stage $M_1$ is converted with the pump frequency $f_{p2}$ to form the output frequency $f_{z2}$. The pump frequency $f_{p2}$ is produced in a pump circuit represented by a voltage source $\underline{V}_{p2}$, a resistance $R_{p2}$ and a reactance $X_{p2}$. The output circuit of the parametric up converter stage $M_2$, which is shown as a reactance $X_{p2+z1}$, is connected to the subsequent stages of the receiving system, which are represented by a resistance $R_E'$. The output resistance of the parametric down converter M is $R_A$.

With a parallel type parametric down converter M as shown in FIG. 4, the antenna is represented by the current source $\underline{I}_{p1}^{+z_1}$, a conductance $G_{p1}^{\pm z_1}$ and a susceptance of $B_{p1 \pm z1}$. The parallel type parametric down converter stage $M_1$ provides a current $\underline{I}_{p1}$ at the pump frequency $f_{p1}$ and the pump circuit has a conductance $G_{p1}$ and a susceptance $B_{p1}$. The parameters of this parametric down converter stage $M_1$ and the impedance of the antenna are selected so as to satisfy equation (2). The signals from the antenna and from the pump circuit are converted in the reactance diode $D_1$ which has a conductance loss $G_{D1}$. The output circuit of the parametric down converter stage $M_1$ is represented by an impedance $\underline{Y}_{z1}$ and provides a signal $\underline{V}_{z1}$ to the cascade connected up converter stage $M_2$.

As shown, the up converter stage $M_2$ includes a further reactance diode $D_2$ having a conductance loss $G_{D2}$ and a pump circuit represented by a current source $\underline{I}_{p2}$, a conductance $G_{p2}$ and a susceptance $B_{p2}$. In the output circuit of the up converter stage $M_2$, which is represented by the impedance $\underline{Y}_{p2+z1}$, there is provided the desired current $\underline{I}_z$ at the intermediate frequency $f_z$ which is supplied to the subsequently connected load represented by the conductance $G_E'$. The output conductance of the parametric down converter M is $G_A$.

Figure 5:
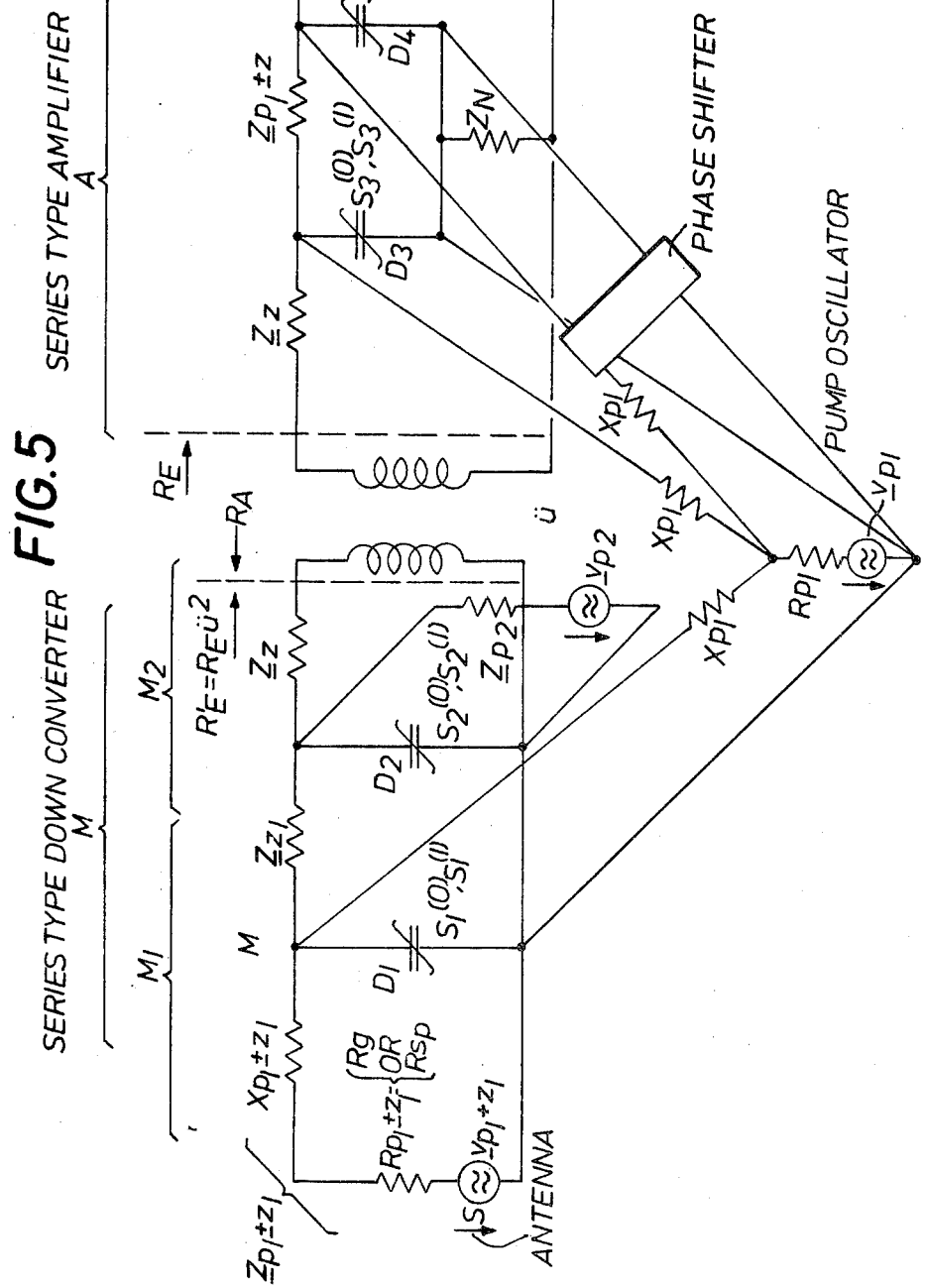
FIG. 5 is an equivalent circuit diagram of the entire down converter M of the series type according to the invention and a subsequently connected IF amplifier of the series type, realized by a parametric converter cascade.

According to a further feature of the present invention, a suitable IF amplifier A is connected in series with the output circuit of the parametric down converter M, as shown, for example, in FIGS. 5 and 6. With such an arrangement it is possible to obtain a low noise input circuit by noise matching of the IF amplifier so that its noise temperature is brought to its minimum value $(T_{IF})_{min}$. For this purpose, the following condition must be met:

$$R_A = R_{S,min} \cdot u^2 \text{ or } G_A = G_{S,min}/u^2 \tag{6}$$

where $R_{S,min}$ or $G_{S,min}$ is the input resistance or conductance, respectively, of the IF amplifier for minimum noise and u is the transforming ratio of the transformer between the output of the parametric down converter M and the input of the IF amplifier A, as shown in each of FIGS. 5 and 6.

According to the Friis formula, this input circuit, including the converter cascade M and the IF amplifier A, then has the noise temperature $$T_{total} = T_{casc} + \frac{(T_{IF})_{min}}{L_{v,\,casc}}. \tag{7}$$

However, since, according to equation (3), $$L_{v,casc} >> 1, \text{ it follows that} \tag{8}$$

$$T_{total} \approx T_{casc}.$$

With the present invention, it is possible to obtain noise matching of the IF amplifier and power matching of the parametric down converter M simultaneously. To achieve these results, according to the invention, a series type IF amplifier is utilized with a series type parametric down converter M, or a parallel type IF amplifier is utilized with a parallel type parametric down converter M, and the IF amplifier must satisfy a preset condition.

In particular, if the series type parametric down converter M, e.g. as shown in FIG. 3, is selected, then the subsequently connected series type IF amplifier must meet the condition:

$$\frac{R_E}{R_{S,min}} = \frac{f_{z1}}{f_{s1}} \cdot \frac{1}{q_1} \tag{9}$$

where $R_E = R_E'/u^2$ is the input resistance of the IF amplifier.

A particularly advantageous embodiment of a series type IF amplifier A satisfying this condition when utilizing a down converter M of the series type is obtained by using a parametric converter cascade amplifier of the series type, as shown in FIG. 5. Such an amplifier comprises a cascade connection of a parametric up converter and a parametric down converter whose reactance diodes $D_3$ and $D_4$ are pumped by a common pump oscillator at the same frequency but in phase quadrative. Such parametric converter cascade amplifiers are described, for example, in U.S. Pat. No. 3,711,780, issued Jan. 16, 1973, to R. Maurer. Preferably, as shown, a common pump oscillator is used for the stages of the amplifier A and for the parametric down converter stage $M_1$.

Alternatively, instead of the converter cascade amplifier shown in FIG. 5, other series type amplifier configurations could be used for the IF amplifier connected to the series type parametric down converter, as long as the parameters of the amplifier circuit are selected so that the condition of equation (9) is satisfied. The desired IF amplifier can be realized if the active element is, for example, any of the following: a tube connected in a grounded grid configuration; a transistor connected in a common base configuration; or a field effect transistor connected in a common gate configuration.

If, however, a parallel type parametric down converter M as shown, for example, in FIG. 4 is utilized, then the subsequently connected IF amplifier must meet the condition $$\frac{G_E}{G_{S,min}} = \frac{f_{z1}}{f_{s1}} \cdot \frac{1}{q_1} \tag{10}$$

wherein $G_E = G_E' u^2$ is the input conductance of the IF amplifier A.

Again, a particularly advantageous embodiment of an IF amplifier which satisfies this condition for a parametric down converter M of the parallel type is a parametric converter cascade amplifier of the parallel type, as shown in FIG. 6. Such an amplifier is especially advantageous since it is nonreciprocal and provides extremely good decoupling between its input and output in that its feedback admittance is suitably neutralized, as described, for example, in U.S. Pat. No. 3,237,017. By utilizing a parallel type converter cascade amplifier A with the parallel type parametric down converter M, the desired power matching for the entire mixer is obtained. Again, as shown, a common pump oscillator or source is used for both the down converter stage $M_1$ and for both stages of the amplifier A.

Again, other parallel type amplifier configurations can be used for the IF amplifier connected to the parallel type parametric down converter M, as long as the parameters of the circuit are selected so that the condition of equation (10) is satisfied. Such IF amplifiers can be realized if the active element of the IF amplifier circuit is, for example, any of the following: a tube connected in a grounded cathode configuration; a transistor connected in a common emitter configuration; or a field effect transistor connected in a common source configuration.

The present invention will now be explained in greater detail with respect to the embodiment shown in FIG. 6.

In this embodiment, the down converter M is of the parallel type and the reactance mixing diodes of the stages $M_1$ and $M_2$ are identified as $D_1$ and $D_2$, respectively. $\underline{Y}_{p1 \pm z1}$ identifies the admittance of the input circuit of the down converter stage $M_1$, where $p_1 + z_1$ is the input signal frequency and $p_1 - z_1$ is the image frequency.

The admittance of the intermediate frequency circuit for the down converter stage $M_1$ is indicated by $\underline{Y}_{z1}$ while the intermediate frequency circuit for the up converter stage $M_2$ is indicated by $\underline{Y}_z$. Under the condition that the pump frequency $f_{p1}$ of the down converter stage $M_1$ is much greater than the intermediate or output frequency $f_{z1}$ of the down converter stage $M_1$, the two frequencies $p_1 + z_1 = f_{s1}$ and $p_1 - z_1 = f_{sp}$ are situated relatively closely together. Consequently, the antenna conductance $G_{p1+z1}$ (or antenna resistance $R_{p1+z1}$ in the case of a series type down converter) which is at the antenna temperature $T_A$ can then be used simultaneously to terminate the image frequency, i.e. $T_{sp} = T_A$. Moreover, when $f_{s1} \approx f_{sp}$, then $R_g \approx R_{sp}$ or $G_g \approx G_{sp}$ for the respective circuit arrangements and thus the condition of equations (1) or (2), respectively, is also satisfied automatically.

With $T_{sp} = T_A$ it follows from equation (4) that $$T_{case} = \frac{f_{s1}}{f_{sp}} \cdot T_A + \frac{4}{q_1} \cdot T_D$$

Consequently $T_{case}$ is somewhat greater than $T_D$ for $T_A = T_D$, but generally $T_{case} < T_D$ for $T_A << T_D$.

The microwave antenna to which the entire down converter $M = M_1 + M_2$ is connected is shown in FIG. 6 by the signal source identified with the letter S. In this embodiment, the down converter M is of the parallel type and consequently, according to the invention, has connected to it a converter cascade amplifier A of the parallel type. The two reactance diodes of the converter cascade amplifier A are marked $C_3$ and $C_4$. At both its input and its output, this IF amplifier has a parallel resonant circuit with an admittance $Y_z$ which is tuned to the intermediate frequency $f_z$. The two reactance diodes $C_3$ and $C_4$ are coupled together via a common idle circuit identified by $\underline{Y}_{p1 \pm z}$. The IF amplifier A is coupled to the down converter M by a transformer with the transforming ratio $\ddot{u}^2$. The output conductance of the parametric down converter M is identified as $G_A$, while the input conductance of the IF amplifier A is marked $G_E$.

Under the above given conditions and if there is power matching at the input and at the output with simultaneous high gain, an input circuit according to the invention can achieve noise temperatures which, according to equations (4) and (7) and with sufficient diode quality $q_1$, lie below room temperature without the input circuit being cooled.

Preferably, as shown in FIGS. 5 and 6, a common pump oscillator is utilized for the input circuit to pump the down converter stage $M_1$ as well as the stages of the parametric IF amplifier A.

The circuit according to the invention has the particular advantage that the pump frequencies $f_{p1}$, $f_{p2}$ lie below the input signal frequencies $f_{s1} = f_{p1} + f_{z1}$. Moreover, the circuit according to the invention can easily be provided in integrated techniques.

It will be understood that the above description of the present invention is susceptible to various modifications, changes and adaptations and the same are intended to be comprehended within the meaning and range of equivalents of the appended claims.

What is claimed is:

1. In a microwave input circuit including a parametric upper sideband down converter for receiving an input signal whose frequency is not much different from the intermediate frequency ($f_2$) produced at the output of said down converter, said converter having its signal input directly connected to a microwave antenna and terminated by a real impedance at the input signal frequency; the improvement wherein: said parametric down converter is of the series type; said signal input is terminated with the real antenna resistance ($R_g$) at the input signal frequency ($f_{s1}$); said down converter comprises a cascade connection of first and second parametric converter stages with said first converter stage ($M_1$) being a series type down converter including a first reactance diode and a first pump circuit, and with said second converter stage ($M_2$) being a series type up converter including a second reactance diode and a second pump circuit; said down converter stage is terminated at its image frequency ($f_{sp}$) with a real resistance ($R_{sp}$) and the following relationship is satisfied:

$$\frac{f_{s1}}{f_{sp}} \cdot \frac{R_g + R_{s1}}{R_{sp} + R_{s1}} \approx 1$$

where $R_{s1}$ is the series resistance of said first reactance diode in said first converter stage.

2. The circuit defined in claim 1 wherein said first pump circuit produces a first pump frequency which is substantially greater than the intermediate frequency produced by said first converter stage.

3. The circuit defined in claim 1 wherein the first pump circuit comprises means for multiplying the pump frequency produced by said second pump circuit by a low order of magnitude.

4. The circuit defined in claim 1, further comprising: a noise-matched IF amplifier of the series type having its input connected to the output of said up converter stage, and hence the output of said parametric down converter, said IF amplifier satisfying the following relationship for $R_{s1} = R_{s2}$;

$$\frac{R_E}{R_{s,min}} \approx \frac{f_{z1}}{f_{s1}} \cdot \frac{1}{q_1}$$

where
$R_E$ = the input resistance of said IF amplifier;
$R_{s,min}$ = the resistance of the signal source of said IF amplifier for noise matching
$f_{z1}$ = the intermediate frequency produced by said first converter stage;
$q_1$ = the dynamic quality factor of said first reactance diode in the first converter stage;
$R_{s2}$ = the series resistance of said second reactance diode in said second converter stage.

5. The circuit defined in claim 4 wherein said IF amplifier includes a tube connected in a grounded grid configuration.

6. The circuit defined in claim 4 wherein said IF amplifier includes a bipolar transistor connected in a common base configuration.

7. The circuit defined in claim 4 wherein said IF amplifier includes a field effect transistor connected in common gate configuration.

8. The circuit defined in claim 4 wherein said IF amplifier is a parametric converter cascade amplifier of the series type.

9. The circuit defined in claim 8 wherein a common pump oscillator is used for said down converter stage $M_1$ and for said IF converter cascade amplifier.

10. The circuit defined in claim 1 wherein the pump frequencies of said down converter stage $M_1$ and of said up converter stage $M_2$ are selected so that said cascade $M_1$–$M_2$ forms an amplifier, i.e. $f_{s1} \approx f_z$.

11. In a microwave input circuit including a parametric upper sideband down converter for receiving an input signal whose frequency is not much different from the intermediate frequency ($f_2$) produced at the output of said down converter, said converter having its signal input directly connected to a microwave antenna and terminated by a real impedance at the input signal frequency; the improvement wherein: said parametric down converter is of the parallel type; said signal input is terminated with the real antenna conductance ($G_g$) at the input signal frequency ($f_{s1}$); said down converter comprises a cascade connection of first and second parametric converter stages with said first converter stage ($M_1$) being a parallel type down converter including a first reactance diode and a first pump circuit, and with said second converter stage ($M_2$) being a parallel type up converter including a second reactance diode and a second pump circuit; said down converter stage is terminated at its image frequency ($f_{sp}$) with a real conductance ($G_{sp}$) and the following relationship is satisfied:

$$\frac{f_{sp}}{f_{s1}} \cdot \frac{G_g + G_{D1}}{G_{sp} + G_{D1}} \approx 1$$

where $G_{D1}$ is the conductance loss of said first reactance diode in said first converter stage.

12. The circuit defined in claim 11 wherein said first pump circuit produces a first pump frequency which is substantially greater than the intermediate frequency produced by said first converter stage.

13. The circuit defined in claim 11 wherein the first pump circuit comprises means for multiplying the pump frequency produced by said second pump circuit by a low order of magnitude.

14. The circuit defined in claim 11, further comprising: a noise-matched IF amplifier of the parallel type having its input connected to the output of said up converter stage, and hence the output of said parametric down converter, said IF amplifier satisfying the following relationship:

$$\frac{G_E}{G_{s,min}} \approx \frac{f_{z1}}{f_{s1}} \cdot \frac{1}{q_1}$$

where
$G_E$ = the input conductance of said IF amplifier;
$G_{s,min}$ = the conductance of the signal source of said IF amplifier for noise matching;
$f_{z1}$ = the intermediate frequency produced by said first converter stage;
$q_1$ = the dynamic quality factor of said first reactance diode in the first converter stage.

15. The circuit defined in claim 14 wherein said IF amplifier includes a tube connected in a grounded cathode configuration.

16. The circuit defined in claim 14 wherein said IF amplifier includes a bipolar transistor connected in a grounded emitter configuration.

17. The circuit defined in claim 14 wherein said IF amplifier includes a field effect transistor connected in common source configuration.

18. The circuit defined in claim 14 wherein said IF amplifier is a parametric converter cascade amplifier of the parallel type.

19. The circuit defined in claim 18 wherein a common pump oscillator is used for said down converter stage $M_1$ and for said IF converter cascade amplifier.

20. The circuit defined in claim 11 wherein the pump frequencies of said down converter stage $M_1$ and of said converter stage $M_2$ are selected so that said converter cascade $M_1$–$M_2$ forms an amplifier, i.e. $f_s = f_z$.

* * * * *